United States Patent
Yoon et al.

(10) Patent No.: US 9,818,547 B1
(45) Date of Patent: Nov. 14, 2017

(54) MULTILAYER CERAMIC ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Gun Jung Yoon, Suwon-si (KR); Hyun Hee Gu, Suwon-si (KR); Hye Young Choi, Suwon-si (KR); Jin Woo Lee, Suwon-si (KR); Jae Yeol Choi, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/486,631

(22) Filed: Apr. 13, 2017

(30) Foreign Application Priority Data

Jul. 5, 2016 (KR) .................. 10-2016-0085037

(51) Int. Cl.
| | |
|---|---|
| *H01G 4/30* | (2006.01) |
| *H01G 4/228* | (2006.01) |
| *H01G 4/012* | (2006.01) |
| *H01G 4/248* | (2006.01) |
| *H01G 4/224* | (2006.01) |

(Continued)

(52) U.S. Cl.
CPC ............ *H01G 4/30* (2013.01); *H01G 4/012* (2013.01); *H01G 4/1227* (2013.01);
(Continued)

(58) Field of Classification Search
CPC .......... H01G 4/30; H01G 4/012; H01G 4/248
(Continued)

(56) References Cited

U.S. PATENT DOCUMENTS

| 2013/0128411 A1* | 5/2013 | Tahara .................. C25D 3/56 361/321.2 |
| 2013/0208401 A1* | 8/2013 | Shirakawa ............ H01G 13/06 361/305 |

(Continued)

FOREIGN PATENT DOCUMENTS

| KR | 10-2014-0053562 A | 5/2014 |
| KR | 10-2014-0091440 A | 7/2014 |

(Continued)

OTHER PUBLICATIONS

Office Action dated May 17, 2017, issued in Korean Patent Application No. 10-2016-0085037. With English language translation.

*Primary Examiner* — Sherman Ng

(74) *Attorney, Agent, or Firm* — McDermott Will & Emery LLP (57) ABSTRACT

A multilayer ceramic electronic component includes a ceramic body including a plurality of dielectric layers stacked on each other and having first and second surfaces opposing each other in a first direction, third and fourth surfaces opposing each other in a second direction, parallel to a stacking direction and connected to the first and second surfaces, and fifth and sixth surfaces opposing each other in a third direction and connected to the first to fourth surfaces, first and second external electrodes disposed on the first and second surfaces of the ceramic body, respectively, first and second conductive thin films disposed on at least one of the third and fourth surfaces, connected to the first and second external electrodes, respectively, and having a thickness lower than that of the first and second external electrodes, and first and second solder preventing films disposed on the first and second external electrodes, respectively.

13 Claims, 4 Drawing Sheets

(51) Int. Cl.
*H05K 1/11* (2006.01)
*H05K 1/18* (2006.01)
*H01G 4/12* (2006.01)

(52) U.S. Cl.
CPC ............. *H01G 4/224* (2013.01); *H01G 4/248* (2013.01); *H05K 1/111* (2013.01); *H05K 1/181* (2013.01); *H05K 2201/10015* (2013.01)

(58) Field of Classification Search
USPC .......................................... 361/301.4, 306.3
See application file for complete search history.

(56) References Cited

U.S. PATENT DOCUMENTS

| | | |
|---|---|---|
| 2014/0116766 A1 | 5/2014 | Jeon et al. |
| 2014/0196936 A1* | 7/2014 | Hong .................... H05K 7/1422 174/257 |
| 2014/0198427 A1* | 7/2014 | Kamobe .................. H01G 4/30 361/301.4 |
| 2015/0083475 A1 | 3/2015 | Kim et al. |
| 2015/0124370 A1 | 5/2015 | Ahn et al. |
| 2015/0243438 A1 | 8/2015 | Ahn et al. |
| 2015/0279562 A1 | 10/2015 | Nishisaka et al. |
| 2016/0027585 A1* | 1/2016 | Inoue .................... H01G 4/0085 361/301.4 |
| 2016/0260547 A1* | 9/2016 | Park ........................ H01G 4/005 |

FOREIGN PATENT DOCUMENTS

| | | |
|---|---|---|
| KR | 10-2015-0033392 A | 4/2015 |
| KR | 10-2015-0051667 A | 5/2015 |
| KR | 10-1532180 B1 | 6/2015 |
| KR | 10-2015-0113903 A | 10/2015 |

\* cited by examiner

MULTILAYER CERAMIC ELECTRONIC COMPONENT AND BOARD HAVING THE SAME

CROSS-REFERENCE TO RELATED APPLICATION(S)

This application claims benefit of priority to Korean Patent Application No. 10-2016-0085037 filed on Jul. 5, 2016 in the Korean Intellectual Property Office, the disclosure of which is incorporated herein by reference in its entirety.

TECHNICAL FIELD

The present disclosure relates to a multilayer ceramic electronic component and a board having the same.

BACKGROUND

In accordance with the recent trend for the miniaturization of electronic products, multilayer ceramic electronic components have also been required to have a small size and high capacitance.

Therefore, various methods for decreasing the thicknesses of dielectric layers and internal electrodes and increasing the numbers of stacked dielectric layers and internal electrodes have been attempted, and multilayer ceramic electronic components in which the thickness of dielectric layers is decreased and the number of stacked dielectric layers is increased have been recently manufactured.

In addition, in order to decrease a size of an electronic product and increase capacitance of a capacitor, or the like, a structural change to form a capacitor such as a bottom landed ceramic capacitor (BLCC), a high profile ceramic capacitor (HPCC), or the like, has been attempted.

In addition, it has become important to decrease intervals between land patterns on a board in order to implement high integration by increasing the number of electronic components that may be mounted in the same area.

SUMMARY

An aspect of the present disclosure may provide a multilayer ceramic electronic component having high capacitance by decreasing a thickness of external electrodes and having a structure capable of preventing solders from being attached to both end surfaces of the multilayer ceramic electronic component at the time of being mounted on a substrate, and a board having the same.

According to an aspect of the present disclosure, a multilayer ceramic electronic component may include: a ceramic body including a plurality of dielectric layers stacked on each other and having first and second surfaces opposing each other in a first direction, third and fourth surfaces opposing each other in a second direction, parallel to a stacking direction and connected to the first and second surfaces, and fifth and sixth surfaces opposing each other in a third direction and connected to the first to fourth surfaces; first and second internal electrodes exposed to the first and second surfaces of the ceramic body, respectively, with respective dielectric layers interposed therebetween; first and second external electrodes disposed on the first and second surfaces of the ceramic body, respectively, and connected to the first and second internal electrodes, respectively; first and second conductive thin films disposed on at least one of the third and fourth surfaces of the ceramic body, connected to the first and second external electrodes, respectively, and having a thickness lower than that of the first and second external electrodes; and first and second solder preventing films disposed on the first and second external electrodes, respectively.

According to another aspect of the present disclosure, a board having a multilayer ceramic electronic component may include: a substrate having a first electrode pad and a second electrode pad disposed on one surface thereof; and the multilayer ceramic electronic component attached to the substrate by solders. The multilayer ceramic electronic component includes: a ceramic body formed by stacking a plurality of dielectric layers and having first and second surfaces opposing each other in a first direction, third and fourth surfaces opposing each other in a second direction, parallel to a stacking direction and connected to the first and second surfaces, and fifth and sixth surfaces opposing each other in a third direction and connected to the first to fourth surfaces; first and second internal electrodes exposed to the first and second surfaces of the ceramic body, respectively, with respective dielectric layers interposed therebetween; first and second external electrodes disposed on the first and second surfaces of the ceramic body, respectively, and connected to the first and second internal electrodes, respectively; first and second conductive thin films disposed on at least one of the third and fourth surfaces of the ceramic body, connected to the first and second external electrodes, respectively, and having a thickness lower than that of the first and second external electrodes; and first and second solder preventing films disposed on the first and second external electrodes, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Directions of a hexahedron will be defined in order to clearly describe exemplary embodiments in the present disclosure. L, W, and T illustrated in the drawings refer to a length direction, a width direction, and a thickness direction, respectively. Here, the thickness direction refers to a stacking direction in which dielectric layers are stacked. The length direction may be defined and used as a first direction, the stacking direction may be defined and used as a second direction, and the width direction may be defined and used as a third direction.

Multilayer Ceramic Electronic Component

A multilayer ceramic electronic component according to an exemplary embodiment in the present disclosure, particularly, a multilayer ceramic capacitor, will hereinafter be described. However, the multilayer ceramic electronic component according to the present disclosure is not limited thereto.

Figure 1:
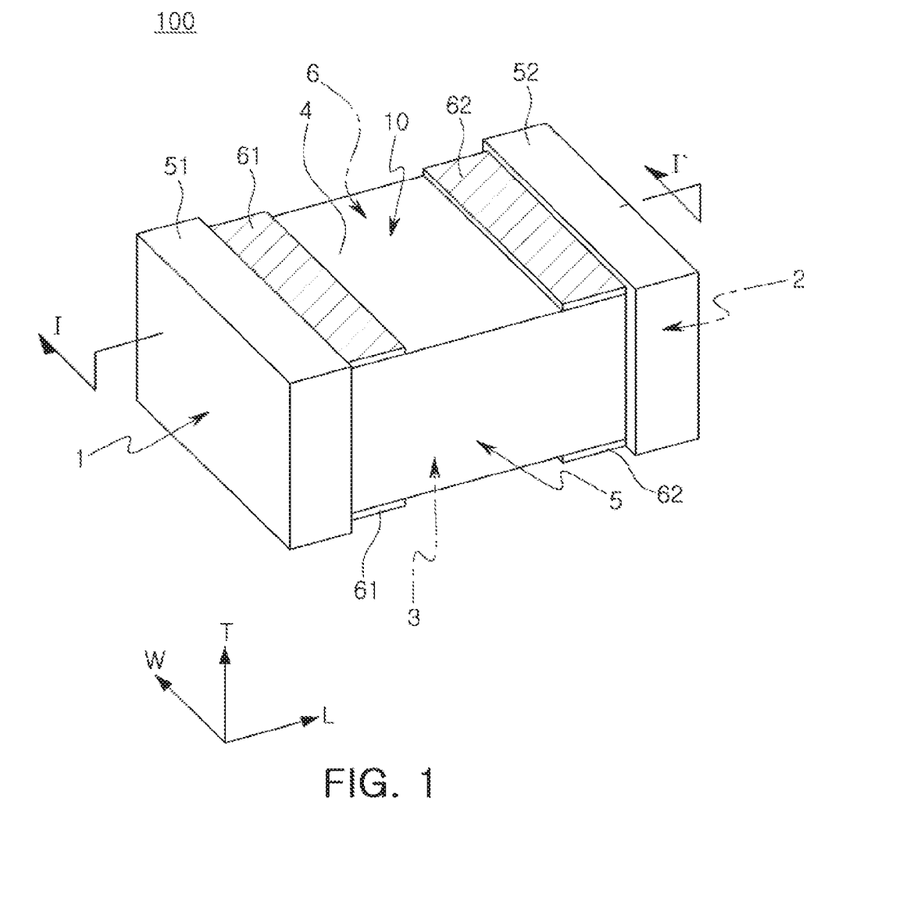
FIG. 1 is a schematic perspective view illustrating a multilayer ceramic electronic component according to an exemplary embodiment in the present disclosure.
Figure 2:
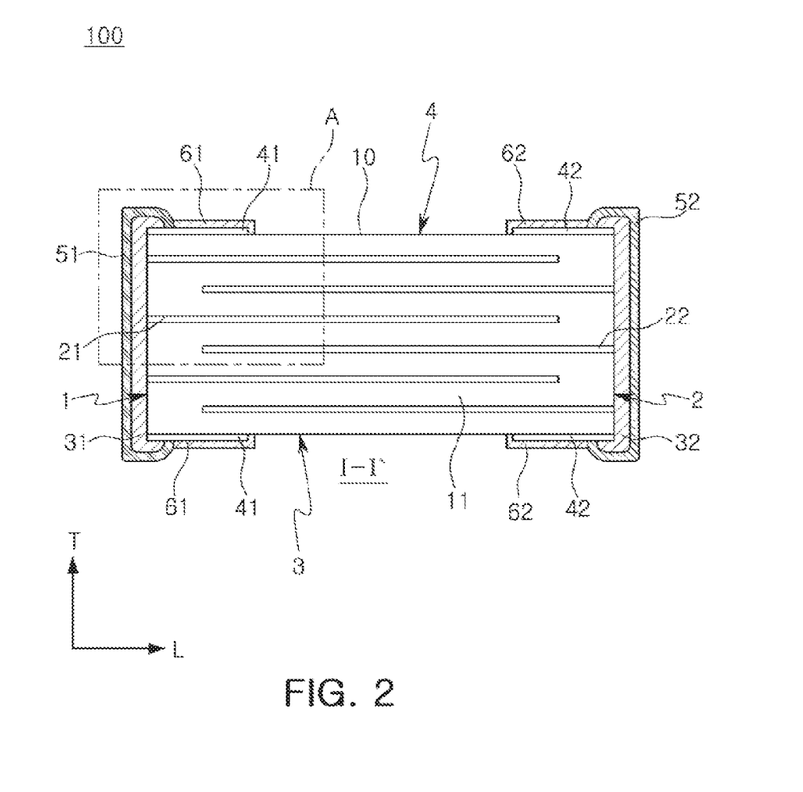
FIG. 2 is a schematic cross-sectional view taken along line I-I' of FIG. 1.

FIG. 1 is a schematic perspective view illustrating a multilayer ceramic electronic component according to an exemplary embodiment in the present disclosure, while FIG. 2 is a schematic cross-sectional view taken along line I-I' of FIG. 1.

Referring to FIG. 1, a multilayer ceramic electronic component 100 according to an exemplary embodiment in the present disclosure may include a ceramic body 10, solder preventing films 51 and 52, and plating layers 61 and 62.

The ceramic body 10 may be formed as a hexahedron having first and second surfaces 1 and 2, both end surfaces in the length direction L, third and fourth surfaces 3 and 4, both surfaces in the stacking direction T, and fifth and sixth surfaces 5 and 6, both side surfaces in the width direction W.

The solder preventing films 51 and 52 may be disposed on the first and second surfaces 1 and 2 of the ceramic body 10, respectively.

The solder preventing films 51 and 52 may extend from the first and second surfaces 1 and 2 of the ceramic body 10 to the third and fourth surfaces 3 and 4 of the ceramic body 10 adjacent to the first and second surfaces 1 and 2 or extend from the first and second surfaces 1 and 2 of the ceramic body 10 to the third to sixth surfaces 3 to 6 of the ceramic body 10 adjacent to the first and second surfaces 1 and 2.

The solder preventing films 51 and 52 may be formed using an insulating paste.

The insulating paste forming the solder preventing films 51 and 52 may include a resin and an insulating material.

The resin included in the insulating paste may be an epoxy resin or an acryl resin, and the insulating material may be any one selected from the group consisting of oxides of Si, Al, Ti, Mn, and Mg, or mixtures thereof.

The plating layers 61 and 62 may be disposed on the third and fourth surfaces 3 and 4, both surfaces of the ceramic body 10 in the stacking direction T.

As described below, the third or fourth surface 3 or 4 of the ceramic body 10 may be provided as a mounting surface at the time of mounting the multilayer ceramic electronic component on a substrate. For example, the third surface 3 of the ceramic body 10 may be provided as the mounting surface. In a case in which the third surface 3 of the ceramic body 10 is provided as the mounting surface, the plating layers 61 and 62 may also only be formed on the third surface 3.

A structure of the multilayer ceramic electronic component 100 according to the exemplary embodiment will be described in more detail with reference to FIG. 2.

The ceramic body 10 may be formed by stacking a plurality of dielectric layers 11 in the thickness direction T and then sintering the plurality of dielectric layers 11. Shapes and dimensions of the ceramic body 10 and the number of stacked dielectric layers 11 are not limited to those of an example illustrated in the present exemplary embodiment.

In addition, the plurality of dielectric layers 11 forming the ceramic body 10 may be in a sintered state, and adjacent dielectric layers 11 may be integrated with each other such that boundaries therebetween may not be readily apparent without the use of a scanning electron microscope (SEM).

The dielectric layer 11 may have a thickness arbitrarily changed in accordance with a capacitance design of the multilayer ceramic electronic component 100, and may include ceramic powder particles having a high dielectric constant, such as barium titanate ($BaTiO_3$) based powder particles or strontium titanate ($SrTiO_3$) based powder particles. However, a material of the dielectric layer 11 according to the present disclosure is not limited thereto. In addition, various ceramic additives, organic solvents, plasticizers, binders, dispersants, and the like, may be added into the ceramic powder particles according to an object of the present disclosure.

An average particle size of the ceramic powder particles used to form the dielectric layer 11 is not particularly limited, but may be controlled in order to accomplish an object of the present disclosure. For example, the average particle size of the ceramic powder particles used to form the dielectric layer 11 may be controlled to be 400 nm or less.

First and second internal electrodes 21 and 22, a pair of electrodes having different polarities, may be formed to be alternately exposed through the first and second surfaces 1 and 2, both end surfaces of the ceramic body 10 in the length direction L, in the stacking direction of the dielectric layers 11 by printing a conductive paste including a conductive metal at a predetermined thickness on the plurality of dielectric layers 11 stacked in the thickness direction T, and may be electrically insulated from each other by respective dielectric layers 11 disposed therebetween.

That is, the first and second internal electrodes 21 and 22 may be electrically connected, respectively, to first and second external electrodes 31 and 32 formed, respectively, on both end surfaces of the ceramic body 10 in the length direction L through portions thereof alternately exposed through the first and second surfaces 1 and 2 of the ceramic body 10.

First and second conductive thin films 41 and 42 may be disposed on at least one of the third and fourth surfaces 3 and 4 of the ceramic body 10. The first and second conductive thin films 41 and 42 may have a thickness lower than that of the first and second external electrodes 31 and 32, and may be electrically connected to the first and second external electrodes 31 and 32, respectively.

In a case in which at least one of the third and fourth surfaces 3 and 4 of the ceramic body 10 is provided as the mounting surface, the first and second plating layers 61 and 62 may be disposed to cover at least portions of the conductive thin films 41 and 42, respectively.

The first and second plating layers 61 and 62 may also be formed on both of the third and fourth surfaces 3 and 4.

As seen in FIG. 2, the first and second external electrodes 31 and 32 may be blocked from external sources by the first and second solder preventing films 51 and 52, respectively. The first and second solder preventing films 51 and 52 may be formed using an insulating material.

The first and second solder preventing films 51 and 52 may prevent solders from being formed on the first and second surfaces 1 and 2 of the ceramic body 10 at the time of mounting the multilayer ceramic electronic component on a substrate and prevent conductive foreign materials from being introduced into the ceramic body 10 through cracks, or the like, generated in the first and second external electrodes 31 and 32, as described below.

When voltages are applied to the first and second external electrodes 31 and 32, electric charges may be accumulated between the first and second internal electrodes 21 and 22 facing each other. In this case, capacitance of the multilayer ceramic capacitor 100 may be in proportion to an area of a region in which the first and second internal electrodes 21 and 22 overlap each other.

In addition, the conductive metal included in the conductive paste forming the first and second internal electrodes 21 and 22 may be nickel (Ni), copper (Cu), palladium (Pd), silver (Ag), lead (Pb), or platinum (Pt), or alloys thereof. However, the conductive metal according to the present disclosure is not limited thereto.

Figure 3:
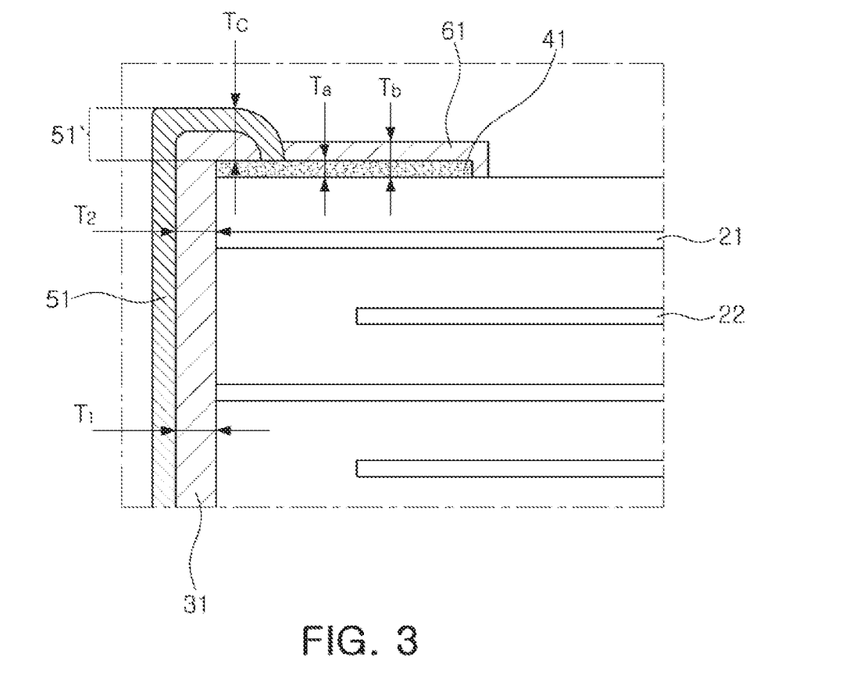
FIG. 3 is a schematic enlarged view of part A of FIG. 2.

FIG. 3 is a schematic enlarged view of part A of FIG. 2. Structures of the external electrodes 31 and 32, the conductive thin films 41 and 42, the solder preventing films 51 and 52, and the plating layers 61 and 62, and methods of forming the external electrodes 31 and 32, the conductive thin films 41 and 42, the solder preventing films 51 and 52, and the plating layers 61 and 62 will be described with reference to FIG. 3.

A method of forming the conductive thin films 41 and 42 is not particularly limited. That is, the conductive thin films 41 and 42 may be formed by a sputtering method, or the like, in order to be formed as thin films.

Alternatively, the conductive thin films 41 and 42 may be formed using a conductive ink paste having a low viscosity. In a case of using the conductive ink paste having the low viscosity, the conductive thin films 41 and 42 may be formed by dispersing metal ions or nanoparticles at a low viscosity and performing heat treatment at a temperature of about 200° C. to 500° C. to grow the metal. As described above, in the case of using the conductive ink paste having the low viscosity, a solids content of the metal is low and a particle size is small, such that a thin metal layer may be formed.

A thickness $T_a$ of the conductive thin films 41 and 42 formed as the thin films may be 50 nm to 5000 nm. Since the conductive thin films 41 and 42 are formed at a thin thickness within the range described above, a thickness of the ceramic body 10 may be increased or the number of stacked dielectric layers 11 may be increased.

In a case in which the thickness $T_a$ of the conductive thin films 41 and 42 is less than 50 nm, it may be difficult to uniformly form the conductive thin films, and a breaking phenomenon may occur, and in a case in which the thickness $T_a$ of the conductive thin films 41 and 42 exceeds 5000 nm, a time required to form the conductive thin films may be unnecessarily increased.

The conductive thin films 41 and 42 may be formed of the same conductive metal as that of the first and second internal electrodes 21 and 22, but are not limited thereto. For example, the conductive metal may be copper (Cu), nickel (Ni), palladium (Pd), platinum (Pt), gold (Au), silver (Ag), iron (Fe), titanium (Ti), carbon (C), or alloys thereof.

The external electrodes 31 and 32 may be formed by a dipping method or a sheet transfer or pad transfer method.

For example, a case in which the external electrodes 31 and 32 are formed by the sheet transfer method will be described below.

A surface plate having a punching elastic member attached to an upper surface thereof may first be prepared in order to form the external electrodes on outer surfaces of the ceramic body 10. A sheet for forming the external electrode may be attached to an upper portion of the punching elastic member.

The surface plate may serve as a support, and may be formed of any material of which strength is high and thermal deformation is low. For example, the surface plate may be a stone surface plate.

The sheet for forming the external electrode, in a state in which a paste for forming the external electrode is thinly applied and is then completely dried, may be called a green sheet.

In detail, the paste for forming the external electrode may be prepared by mixing a conductive metal selected from the group consisting of copper (Cu), nickel (Ni), palladium (Pd), platinum (Pt), gold (Au), silver (Ag), or lead (Pb), or alloys thereof, a binder, a plasticizer, and a dispersant, and the like, with each other.

Then, the paste for forming the external electrode may be applied depending on a required thickness of the external electrode using a doctor blade casting device, or the like, and be then dried to prepare the sheet for forming the external electrode.

Then, the ceramic body 10 may be pressed and closely adhered to the sheet for forming the external electrode to attach the sheet for forming the external electrode to the ceramic body 10. Then, the sheet for forming the external electrode may be cut by the punching elastic member, such that the external electrodes 31 and 32 may be formed on both end surfaces of the ceramic body in the length direction.

That is, the punching elastic member may serve to cut the sheet for forming the external electrode attached to the outer surfaces of the ceramic body.

In a case of using the sheet transfer method as described above, when a thickness of the external electrodes 31 and 32 in a central portion of the ceramic body 10 in the thickness direction is $T_1$ and a thickness of the external electrodes 31 and 32 at a point at which an internal electrode disposed in the outermost portion among the internal electrodes is positioned is $T_2$, $0.8 \le T_2/T_1 \le 1.2$.

$0.8 \le T_2/T_1 \le 1.2$ is satisfied to decrease a deviation between the thickness $T_1$ of the external electrodes 31 and 32 in the central portion of the ceramic body 10 in the thickness direction and the thickness $T_2$ of the external electrodes 31 and 32 at the point at which the internal electrode disposed in the outermost portion among the internal electrodes is positioned, such that deteriorations of reliability may be prevented.

In a case in which $T_2/T_1$ is less than 0.8 or exceeds 1.2, a deviation between thicknesses of the external electrodes is large, such that a plating solution may permeate into a portion having a thin thickness to deteriorate reliability.

The external electrodes 31 and 32 may extend to the third and fourth surfaces 3 and 4 of the ceramic body 10 to cover portions of the first and second conductive thin films 41 and 42, respectively, as illustrated in FIG. 3.

As described below, in the multilayer ceramic electronic component 100 according to the exemplary embodiment, the external electrodes 31 and 32 may be connected to land patterns of a substrate through the conductive thin films 41 and 42, respectively, at the time of mounting the multilayer ceramic electronic component 100 on the substrate. Therefore, the external electrodes 31 and 32 may be disposed to cover portions of the conductive thin films 41 and 42, respectively, such that a connection defect between the external electrodes 31 and 32 and the conductive thin films 41 and 42 may be prevented.

The solder preventing films 51 and 52 may be formed on the external electrodes 31 and 32 formed on the first and second surfaces 1 and 2 of the ceramic body 10, respectively.

Alternatively, the solder preventing films 51 and 52 may extend from the first and second surfaces 1 and 2 of the ceramic body 10 to the third and fourth surfaces 3 and 4 of the ceramic body 10 adjacent to the first and second surfaces 1 and 2 to cover portions of the conductive thin films 41 and 42, respectively.

That is, in a case in which the external electrodes 31 and 32 extend to and are formed on the third and fourth surfaces 3 and 4 of the ceramic body, the solder preventing films 51 and 52 may be disposed to cover, respectively, the external electrodes 31 and 32 formed on the third and fourth surfaces 3 and 4.

The plating layers 61 and 62 may be formed on the conductive thin films 41 and 42, respectively, in order to improve bondability between the conductive thin films and solders at the time of mounting the multilayer ceramic electronic component on the substrate. The plating layers 61 and 62 may be formed by electroplating or electroless plating using the conductive thin films 41 and 42 as seed layers.

The solder preventing films 51 and 52 may include protruding portions 51' further protruding as compared to the plating layers 61 and 62 from the third or fourth surfaces 3 or 4 of the ceramic body 10.

That is, the protruding portions 51' refer to portions of the solder preventing films 51 and 52 protruding outwardly from the third or fourth surfaces 3 or 4 of the ceramic body 10 by $T_c$. That is, when the sum of thicknesses of the plating layers 61 and 62 and the conductive thin films 41 and 42 is $T_b$, $T_c > T_b$.

In a case in which $T_c$ is greater than $T_b$, the protruding portions 51' may serve as preventing jaws preventing the solders from being spread to the first and second surfaces 1 and 2 of the ceramic body 10.

Board Having Multilayer Ceramic Electronic Component

Figure 4:
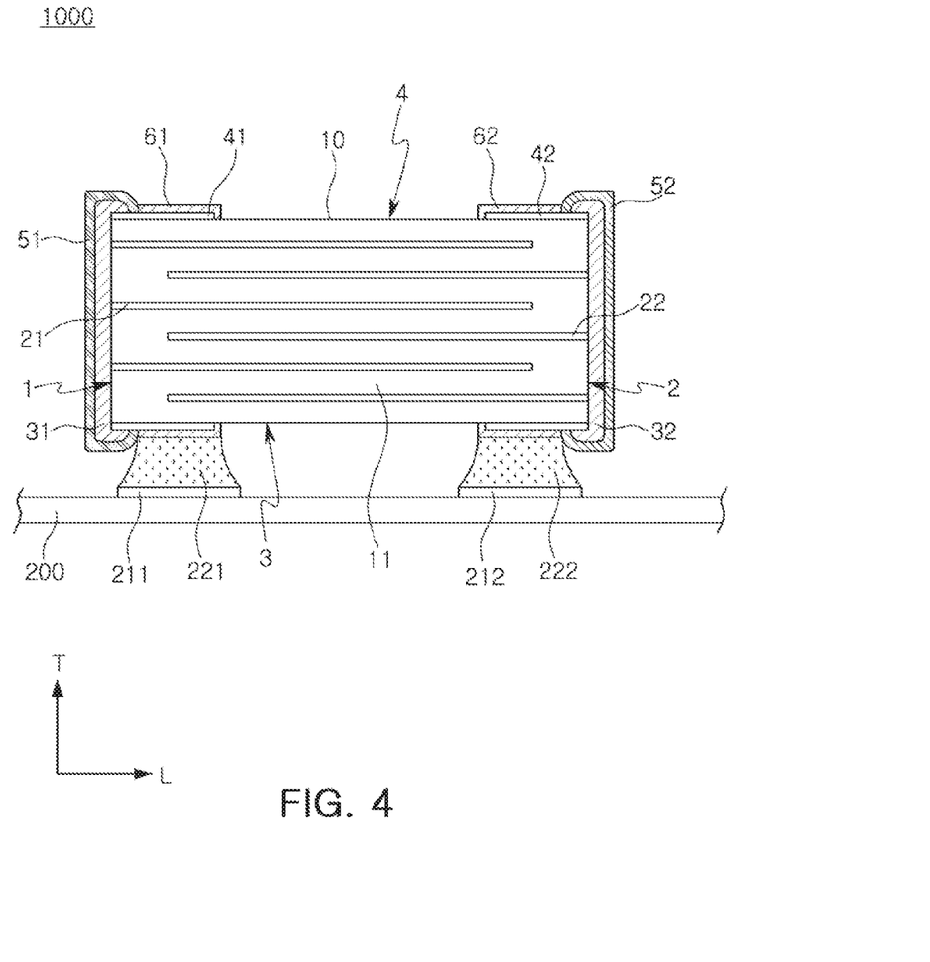
FIG. 4 is a schematic cross-sectional view illustrating a board having a multilayer ceramic electronic component according to another exemplary embodiment in the present disclosure.

FIG. 4 is a schematic cross-sectional view illustrating a board having a multilayer ceramic electronic component according to another exemplary embodiment in the present disclosure.

In FIG. 4, a description of contents overlapping those described above will be omitted.

Referring to FIG. 4, a board 1000 having a multilayer ceramic electronic component according to another exemplary embodiment in the present disclosure may include a substrate 200 and a first electrode pad 211 and a second electrode pad 212 disposed on one surface of the substrate 200.

The multilayer ceramic electronic component 100 attached to the substrate 200 by solders 221 and 222 may be mounted on the substrate 200.

As seen in FIG. 4, a first plating layer 61 may be attached and electrically connected to the first electrode pad 211 by a first solder 221, and a second plating layer 62 may be attached and electrically connected to the second electrode pad 212 by a second solder 222.

In this case, the first solder 221 may be formed from an end portion of a first solder preventing film 51 to an inner end portion of the first plating layer 61, that is, an end portion of the first plating layer 61 adjacent to a central portion of the ceramic body 10 in the length direction. In addition, the second solder 222 may be formed from an end portion of a second solder preventing film 52 to an inner end portion of the second plating layer 62, that is, an end portion of the second plating layer 62 adjacent to a central portion of the ceramic body 10 in the length direction.

In the board 1000 having a multilayer ceramic electronic component according to another exemplary embodiment, the multilayer ceramic electronic component 100 may include the solder preventing films 51 and 52 to thus prevent the solders 221 and 222 from climbing over both end surfaces of the ceramic body 10 in the length direction.

Therefore, as represented in Table 1, an area required for mounting the multilayer ceramic electronic component on the substrate may be decreased.

Table 1 is measurement results illustrating that lengths required for mounting the multilayer ceramic electronic component on the substrate are decreased bilaterally in each direction in a case of using the multilayer ceramic electronic component according to the exemplary embodiment.

TABLE 1

| | Decrease Amount (μm) | |
|---|---|---|
| Kind of Ceramic Electronic Component | 0402 | 0603 |
| Length Direction | 8 | 29 |
| Thickness Direction | 4 | 13 |
| Width Direction | 14 | 25 |

That is, it may be appreciated from Table 1 that when the multilayer ceramic electronic component according to the exemplary embodiment is used, an area required for mounting the multilayer ceramic electronic component on the substrate may be significantly decreased.

Particularly, even in a case in which multilayer ceramic electronic components are mounted at an interval of 100 μm or less, the occurrence of a bridge defect in which solders of adjacent multilayer ceramic electronic components are connected to each other may be prevented.

As set forth above, in the multilayer ceramic electronic component according to the exemplary embodiment in the present disclosure, the conductive thin films may be disposed on both surfaces of the ceramic body in the stacking direction to increase capacitance of the multilayer ceramic electronic component instead of the external electrodes according to the related art, and the solder preventing films may be disposed on the external electrodes disposed, respectively, on both end surfaces of the ceramic body in the length direction to prevent the solders from being attached to both end surfaces of the ceramic body at the time of mounting the multilayer ceramic electronic component on the substrate, such that mounting density may be increased.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising: a ceramic body including a plurality of dielectric layers stacked on each other and having first and second surfaces opposing each other in a first direction, third and fourth surfaces opposing each other in a second direction, parallel to a stacking direction and connected to the first and second surfaces, and fifth and sixth surfaces opposing each other in a third direction and connected to the first to fourth surfaces; first and second internal electrodes exposed to the first and second surfaces of the ceramic body, respectively, with respective dielectric layers interposed therebetween; first and second external electrodes disposed on the first and second surfaces of the ceramic body, respectively, and connected to the first and second internal electrodes, respectively; first and second conductive thin films disposed on at least one of the third and fourth surfaces of the ceramic body, connected to the first and second external electrodes, respectively, and having a thickness lower than that of the first and second external electrodes; first and second solder preventing films disposed on the first and second external electrodes, respectively; and first and second plating layers disposed, respectively, on the first and second conductive thin films on one of the third and fourth surfaces of the ceramic body, provided as a mounting surface of the ceramic body, and wherein the first and second solder preventing films include protruding portions further protruding from the mounting surface of the ceramic body, as compared to the first and second plating layers.

2. The multilayer ceramic electronic component of claim 1, wherein $0.8 \leq T_1/T_1 \leq 1.2$ is satisfied, where $T_1$ is a thickness of the first and second external electrodes in a central portion of the ceramic body in the stacking direction and $T_2$ is a thickness of the first and second external electrodes at a point at which an internal electrode disposed in an outermost portion in the stacking direction among the first and second internal electrodes is positioned.

3. The multilayer ceramic electronic component of claim 1, wherein the first and second conductive thin films have a thickness of 50 nm to 5000 nm.

4. The multilayer ceramic electronic component of claim 1, wherein the first and second external electrodes extend to the third and fourth surfaces of the ceramic body to cover portions of the first and second conductive thin films, respectively.

5. The multilayer ceramic electronic component of claim 1, wherein the first and second solder preventing films extend to the third and fourth surfaces of the ceramic body to cover portions of the first and second conductive thin films, respectively.

6. The multilayer ceramic electronic component of claim 1, wherein the first and second solder preventing films include a resin and an insulating material, the resin is any one selected from the group consisting of an epoxy resin and an acryl resin, or mixtures thereof, and the insulating material is any one selected from the group consisting of oxides of Si, Al, Ti, Mn, and Mg, or mixtures thereof.

7. A board having a multilayer ceramic electronic component, comprising: a substrate having a first electrode pad and a second electrode pad disposed on one surface thereof; and the multilayer ceramic electronic component attached to the substrate by solders, wherein the multilayer ceramic electronic component includes: a ceramic body including a plurality of dielectric layers stacked on each other and having first and second surfaces opposing each other in a first direction, third and fourth surfaces opposing each other in a second direction, parallel to a stacking direction and connected to the first and second surfaces, and fifth and sixth surfaces opposing each other in a third direction and connected to the first to fourth surfaces; first and second internal electrodes exposed to the first and second surfaces of the ceramic body, respectively, with respective dielectric layers interposed therebetween; first and second external electrodes disposed on the first and second surfaces of the ceramic body, respectively, and connected to the first and second internal electrodes, respectively; first and second conductive thin films disposed on at least one of the third and fourth surfaces of the ceramic body, connected to the first and second external electrodes, respectively, and having a thickness lower than that of the first and second external electrodes; first and second solder preventing films disposed on the first and second external electrodes, respectively; and first and second plating layers disposed, respectively, on the first and second conductive thin films on one of the third and fourth surfaces of the ceramic body, provided as a mounting surface of the ceramic body, and wherein the first and second solder preventing films include protruding portions further protruding from the mounting surface of the ceramic body, as compared to the first and second plating layers.

8. The board having a multilayer ceramic electronic component of claim 7, wherein $0.8 \leq T_1/T_1 \leq 1.2$ is satisfied, where $T_1$ is a thickness of the first and second external electrodes in a central portion of the ceramic body in the stacking direction and $T_2$ is a thickness of the first and second external electrodes at a point at which an internal electrode disposed in an outermost portion in the stacking direction among the first and second internal electrodes is positioned.

9. The board having a multilayer ceramic electronic component of claim 7, wherein the first and second conductive thin films have a thickness of 50 nm to 5000 nm.

10. The board having a multilayer ceramic electronic component of claim 7, wherein the first and second external electrodes extend to the third and fourth surfaces of the ceramic body to cover portions of the first and second conductive thin films, respectively.

11. The board having a multilayer ceramic electronic component of claim 7, wherein the first and second solder preventing films extend to the third and fourth surfaces of the ceramic body to cover portions of the first and second conductive thin films, respectively.

12. The board having a multilayer ceramic electronic component of claim 7, wherein the solders are disposed from end portions of the first and second solder preventing films to inner end portions of the first and second plating layers, respectively.

13. The board having a multilayer ceramic electronic component of claim 7, wherein the first and second solder preventing films include a resin and an insulating material, the resin is any one selected from the group consisting of an epoxy resin and an acryl resin, or mixtures thereof, and the insulating material is any one selected from the group consisting of oxides of Si, Al, Ti, Mn, and Mg, or mixtures thereof.

* * * * *